March 27, 1951 S. C. STRIBLING, JR 2,546,837

PARALLELED AMPLIFIER CIRCUITS

Filed Aug. 21, 1947 2 Sheets-Sheet 1

INVENTOR.

STILES C. STRIBLING, JR.

BY Harry Tunick

ATTORNEY

March 27, 1951 S. C. STRIBLING, JR 2,546,837

PARALLELED AMPLIFIER CIRCUITS

Filed Aug. 21, 1947 2 Sheets-Sheet 2

INVENTOR.
STILES C. STRIBLING, JR.

BY Harry Tunick

ATTORNEY

Patented Mar. 27, 1951 2,546,837

UNITED STATES PATENT OFFICE 2,546,837

PARALLELED AMPLIFIER CIRCUITS

Stiles C. Stribling, Jr., Moorestown, N. J., assignor to Radio Corporation of America, a corporation of Delaware Application August 21, 1947, Serial No. 769,772

8 Claims. (Cl. 179—171)

This invention relates to radio frequency amplifier circuits, and particularly to a system employing a pair of amplifier vacuum tubes having a common radio frequency input circuit feeding both tubes in parallel relation.

An object of the invention is to prevent or minimize undesired circulating currents in the outputs of driven electron discharge devices connected in electrically parallel relation.

Another object is to improve the operation of a pair of amplifier stages having similar characteristics which operate in parallel relation and have individual tuning and loading adjusting circuits.

In brief, the system of the invention comprises two paralleled radio frequency amplifier circuits excited in phase by a common driving stage and feeding a common load. Each of the two paralleled amplifier circuits has its own tank circuit for enabling individual adjustments of the tuning and loading, thereby permitting cophasal outputs from the two amplifiers. A common impedance matching network is used between the driving stage and the inputs to the tubes to reduce to a minimum the phase shift which might otherwise occur if individual networks were employed.

The following is a detailed description of the invention in conjunction with a drawing, wherein.

Figures 1, 2:
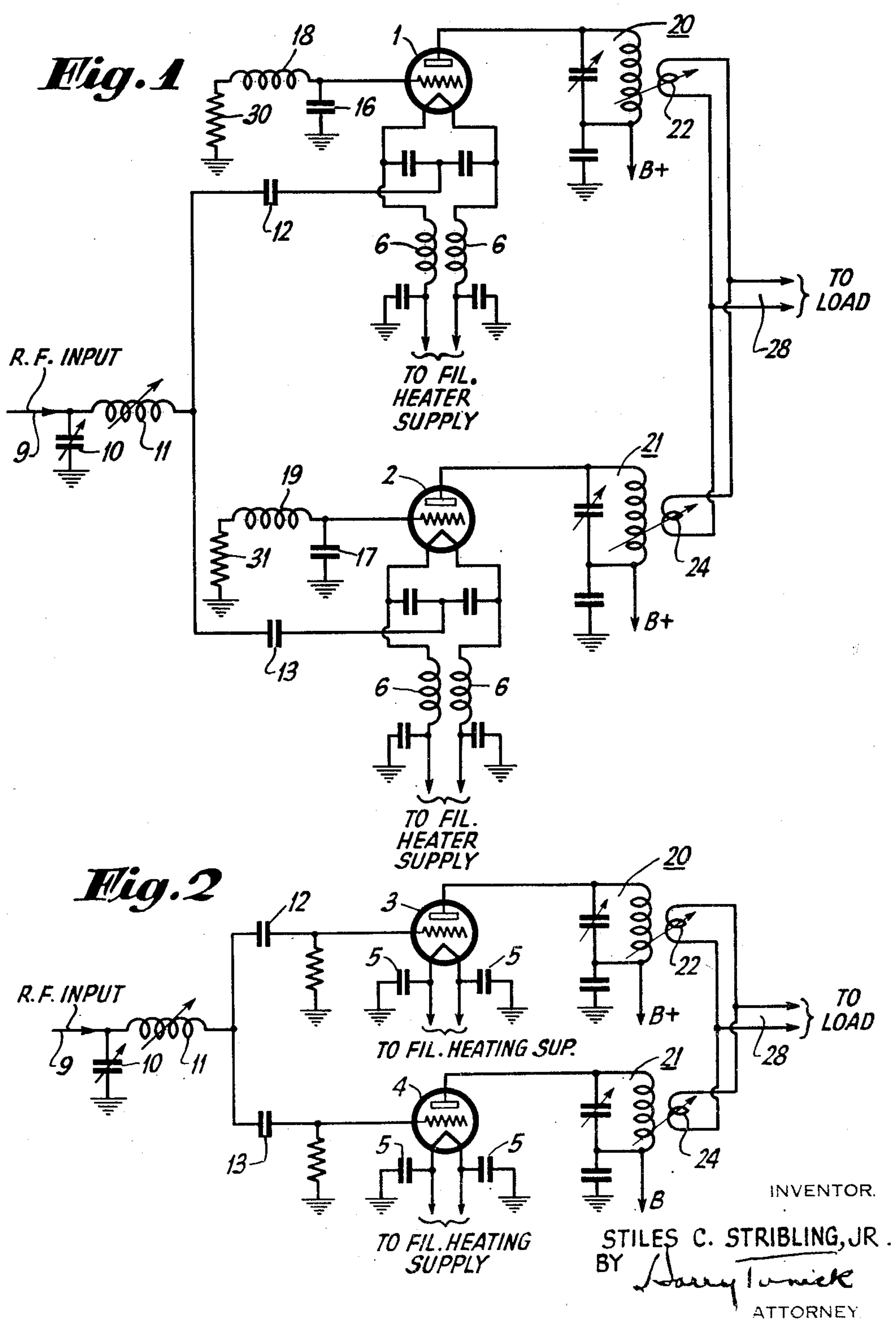
Fig. 1 shows an amplifier circuit of the invention employing a pair of grounded-grid vacuum tubes.
Fig. 2 shows an amplifier circuit of the invention employing a pair of grounded-cathode vacuum tubes.

Referring to Fig. 1 there is shown a radio frequency amplifier stage comprising a pair of triode amplifier tubes 1 and 2 having similar characteristics and whose cathodes are driven over a filter (pi) network 10 and 11 from an input lead 9 which extends to the output of a preceding amplifier stage. The pi network includes a variable capacitor 10 and a variable inductor 11, and also inductances of the leads extending from the inductor 11 to the cathodes of the two tubes. In effect, elements 10 and 11 provide an impedance matching circuit between the driving circuit 9 and the input circuits of the two tubes 1 and 2. At high frequencies, the leads to the tubes 1 and 2 represent an appreciable impedance for which reason the possibility of phase shift in the driving network cannot be eliminated altogether, although this common impedance matching network enables the reduction to an absolute minimum of the phase shift which might otherwise occur if individual networks were employed. Between the inductor 11 and the cathode circuits of the tubes 1 and 2 are provided blocking condensers 12 and 13. The cathodes of the two tubes 1 and 2 will be fed in parallel with the same radio frequency input.

The grids of the tubes 1 and 2 are grounded for radio frequency currents by means of bypass condensers 16 and 17, respectively, and are provided with radio frequency choke coils 18 and 19 and with grid biasing resistors 30 and 31, as shown. Choke coils 6, 6 are provided in the legs of the cathode between the cathode and the heater supply, as shown.

In circuit with the anodes of the two tubes 1 and 2 are separate tank circuits 20 and 21 which feed a common output transmission line 28 over individual couplings 22 and 24. The line 28 extends to a common load circuit, such as an antenna, not shown.

It is preferred that the two vacuum tubes 1 and 2 be as identical as possible, so that they have similar input capacities, and that the arrangement of input and output leads be similar and symmetrical as a result of which the excitation voltages will be equal and in phase.

The use of individual tuned circuits 20 and 21 enables individual tuning and adjustment of the loading. By suitably tuning the tank circuits in the proper directions, the outputs from the two tank circuits may be brought into exact phase and the efficiency of the system thereby increased.

Figures 3, 4:
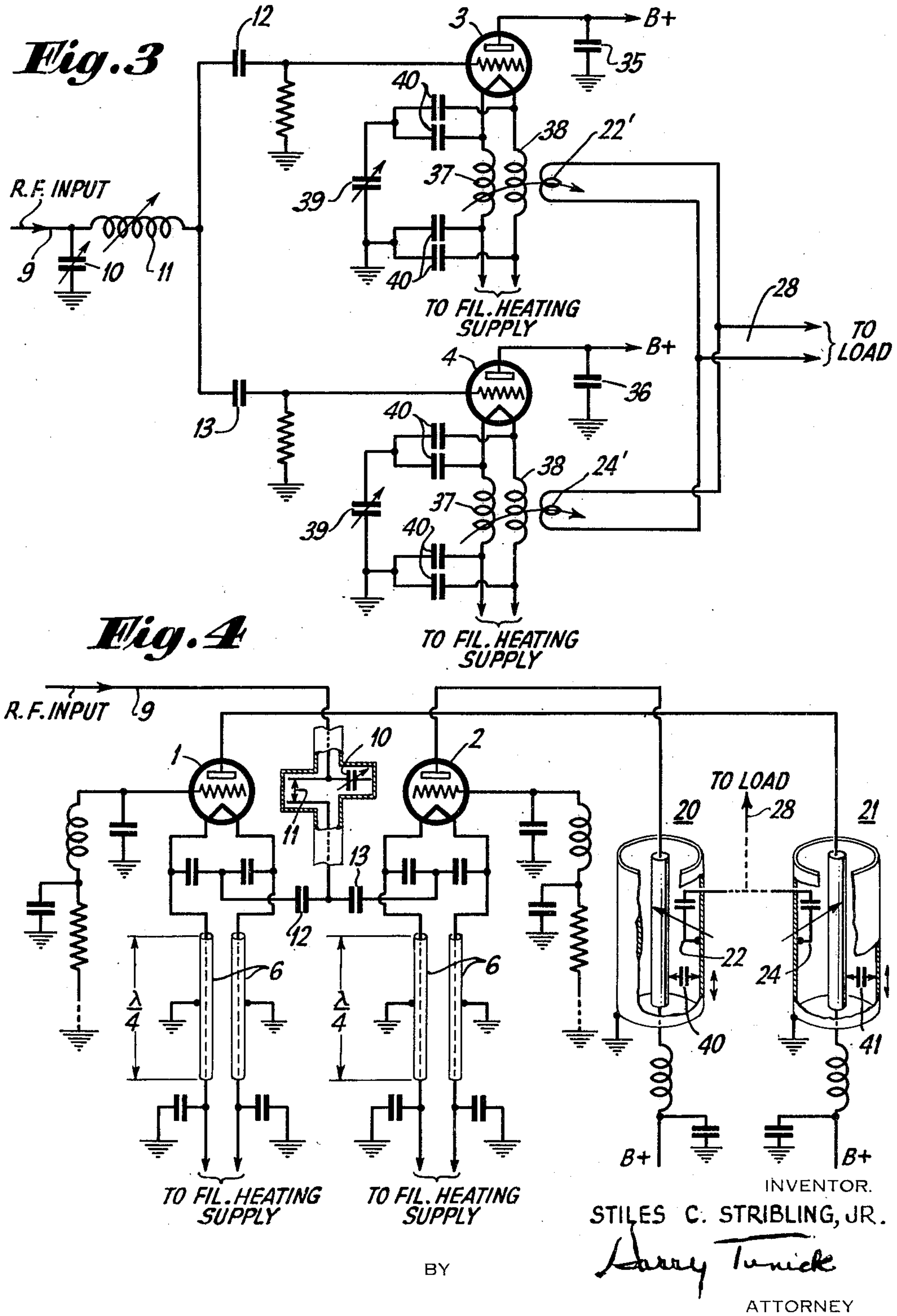
Fig. 3 shows an amplifier circuit of the invention employing a pair of grounded-anode vacuum tubes.
Fig. 4 shows in greater detail the physical layout of the system of Fig. 1 as constructed for use as the final power amplifier stage in a transmitter.

Fig. 4 shows a physical layout of the system of Fig. 1 as used in the final power amplifier stage of a frequency modulation transmitter. The same parts are represented by the same reference numerals. The tubes 1 and 2 of Fig. 4, in an embodiment tried out in practice, were RCA 7C24 tubes. These tubes were used as the final power output stage of a ten KW frequency modulation transmitter operating in the frequency range of 88 to 108 megacycles. In Fig. 4, the cathode radio frequency choke coils 6, 6 are shown as quarter-wavelength sections of coaxial lines. The amplifier output tank circuits 20 and 21 are sections of concentric lines tuned by means of capacitor sliders 40 and 41, respectively. These sliders are movable over the lengths of the tanks. The couplings 22 and 24 are loops having built-in capacitors and located between the inner and outer conductors of the concentric line tanks 20 and 21, respectively. These coupling loops are identical and symmetrically arranged so as to provide substantially equal coupling to the load, as far as possible. The load in this case is an antenna coupled to the leads 29 and 21 by means of line 28 which, in practice, will be a concentric transmission line.

Fig. 2 illustrates the invention applied to a radio frequency amplifier stage having a pair of vacuum tubes 3 and 4 so connected that the radio frequency excitation is applied to the grids of the tubes in parallel, while the outputs are taken from the two tank circuits 20 and 21 connected to the anodes of the tubes. In this figure, the cathodes are grounded for radio frequency energy by means of bypass condensers 5, 5. Except for the fact that the system of Fig. 2 is a grounded-cathode amplifier stage and the system of Fig. 1 is a grounded-grid amplifier stage, the operation of both systems is substantially the same.

Fig. 3 shows the invention applied to a grounded-anode type of amplifier stage. In Fig. 3, the tubes 3 and 4 have the anodes grounded for energy of the operating frequency by means of bypass condensers 35 and 36. In each cathode circuit there are provided a pair of coils 37 and 38 in the legs of the cathode, and the terminals of these coils 37 and 38 are bypassed for energy of the operating frequency to the tuning condenser 39. The condensers 40, 40 are bypass condensers. It will thus be seen that each cathode circuit comprises a tank circuit. Output from the cathode tank circuit of tube 3 is taken off by means of coil 22′ which is coupled to the two coils 37 and 38, while output from the cathode tank circuit of tube 4 is taken off by means of coil 24′ which is coupled to the two coils 37 and 38 of tube 4. Both output coils 22′ and 24′ are adjustable in their positions for obtaining a desired degree of coupling. The common output line 28 is coupled to both tank circuits, as shown. The input and output circuits are preferably arranged symmetrically with respect to the circuit elements of the two tubes of the amplifier stage in order that the excitation voltages be equal and in phase, and the output voltages add and flow to the load without causing circulating current between the tank circuits.

Although the physical layout shown in Fig. 4 has been described with particular reference to the system of Fig. 1, it should be understood that many of the elements employed in Fig. 4 can be used similarly in Figs. 2 and 3. For example, the construction of the common impedance matching networks 10 and 11 used to drive the two tubes may be the same for Figs. 1, 2 and 3. The concentric line tank circuits and the output coupling loops shown in Fig. 4 may similarly be used in Fig. 2.

The term "ground" used in the specification and claims is not limited to an actual earthed connection and is deemed to include any point of reference potential.

What is claimed is:

1. A radio frequency amplifier system comprising two similar vacuum tubes each of which includes first, second and third electrodes, a connection of low impedance to energy of the operating frequency from ground to the first electrode of each of said tubes, another connection of low impedance to energy of the operating frequency coupled between the second electrodes of said tubes, a source of radio frequency signal to be amplified coupled to said last connection at a point symmetrically positioned relative to said tubes and exciting said two tubes with equal voltages in the same phase relation, whereby said second electrodes are fed in parallel, tunable circuits individually coupled to the third electrodes of said tubes, and a common load symmetrically coupled to both tunable circuits in such manner that the outputs from said tunable circuits additively combine in said common load.

2. A radio frequency amplifier system comprising two similar vacuum tubes each of which includes first, second and third electrodes, a connection of low impedance to energy of the operating frequency from ground to the first electrode of each of said tubes, another connection of low impedance to energy of the operating frequency coupled between the second electrodes of said tubes, a source of radio frequency signal to be amplified coupled to said last connection through an impedance matching circuit at a point symmetrically positioned relative to said tubes and exciting said two tubes with equal voltages in the same phase relation, whereby said second electrodes are fed in parallel, tunable circuits individually coupled to the third electrodes of said tubes, and a common load symmetrically coupled to both tunable circuits through adjustable couplings in such manner that the outputs from said tunable circuits additively combine in said common load.

3. A radio frequency amplifier stage comprising first and second vacuum tubes each having a grid, an anode and a cathode, connections of low impedance to energy of the operating frequency from the grids of said tubes to ground, a connection of low impedance to energy of the operating frequency between said cathodes, a source of radio frequency excitation, a filter network coupled between said source and a point on said last connection electrically centered relative to said cathode, said network including a variable inductor and a variable capacitor, individual tank circuits for the anodes of said tubes, and a common load symmetrically coupled to both of said tank circuits.

4. A radio frequency amplifier stage comprising first and second vacuum tubes each having a grid, an anode and a cathode, connections of low impedance to energy of the operating frequency from the grids of said tubes to ground, a connection of low impedance to energy of the operating frequency between said cathodes, a source of radio frequency excitation, a pi filter network coupled between said source and a point on said last connection electrically centered relative to said cathode, said network including a variable inductor and a variable capacitor, individual and similar concentric line tank circuits coupled to the anodes of said tubes, an adjustable slider for each tank circuit for varying the tuning thereof, an output coupling loop for each tank circuit, and a common load symmetrically coupled to said loops, said loops and load being so constructed and arranged that the outputs from said tank circuits additively combine in said load without causing circulating current to flow between said tank circuits.

5. A power amplifier stage for radio frequencies, comprising a pair of grounded-grid vacuum tubes, a common impedance matching circuit symmetrically coupled to the cathodes of both tubes, means for applying the radio frequency signals to be amplified to said common impedance matching circuit, individual output tank circuits for the anodes of said tubes, an adjustable output coupling for each tank circuit, and a transmission line symmetrically coupled in common to said adjustable output couplings in such manner that the outputs from said tank circuit additively combine in said line without causing circulating current to flow between said tank circuits.

6. A radio frequency amplifier stage comprising first and second vacuum tubes each having a grid, an anode and a cathode, a connection of low impedance to energy of the operating frequency between said grids, a common filter network symmetrically coupled to said connection, a source of radio frequency coupled to said filter network, a connection of low impedance to energy of the operating frequency from each of said cathodes to ground, individual tunable tank circuits for the anodes of said tubes and a common output circuit symmetrically coupled to both of said tank circuits in such manner that the outputs from said tank circuits additively combine in said output circuit.

7. A radio frequency amplifier stage comprising first and second vacuum tubes each having a grid, an anode and a cathode, means grounding the anodes of said tubes for energy of the operating frequency, a connection of low impedance to energy of the operating frequency between the grids of said tubes, a radio frequency input circuit symmetrically coupled to said connection through an adjustable filter network, individual tunable tank circuits coupled to the cathodes of said tubes, and a common output circuit symmetrically coupled to said tank circuits.

8. A radio frequency amplifier system comprising two paralleled electron devices having similar input capacities, each of said devices including first, second and third electrodes, a connection of low impedance to energy of the operating frequency from ground to the first electrode of each of said devices, another connection of low impedance to energy of the operating frequency coupled between the second electrodes of said devices, a source of radio frequency signal coupled to said last connection through a common impedance matching circuit at such a location on said last connection that the electrical lengths of the portions of said last connection between said devices and the matching circuit are the same, thereby assuring the application of excitation voltages to said devices which are equal and in phase, similar tunable circuits individually coupled to the third electrodes of said devices, and a common load circuit symmetrically coupled to both tunable circuits through connections of the same electrical length in such manner that the outputs from said tunable circuits additively combine in said load circuit with a minimum of circulating current between said tunable circuits, said tunable circuits being so tuned that the outputs therefrom are in exact phase.

STILES C. STRIBLING, Jr.

REFERENCES CITED

The following references are of record in the file of this patent:

UNITED STATES PATENTS

| Number | Name | Date |
|---|---|---|
| 2,101,438 | Lindenblad | Dec. 7, 1937 |
| 2,136,448 | Lindenblad | Nov. 15, 1938 |
| 2,243,214 | Krauth | May 27, 1941 |
| 2,299,366 | Van der Ziel et al. | Oct. 20, 1942 |
| 2,312,510 | Van der Ziel et al. | Mar. 2, 1943 |
| 2,340,352 | Watts, Jr. | Feb. 1, 1944 |
| 2,429,755 | Hallmark | Oct. 28, 1947 |